United States Patent [19]

Fujii et al.

[11] Patent Number: 5,132,563
[45] Date of Patent: * Jul. 21, 1992

[54] LSI GATE ARRAY HAVING REDUCED SWITCHING NOISE

[75] Inventors: Shigeru Fujii, Yokohama; Kouichi Yamashita, Machida; Tomoaki Tanabe, Yokohama; Yoshio Kuniyasu, Kawasaki, all of Japan

[73] Assignee: Fujitsu Limited, Kawasaki, Japan

[*] Notice: The portion of the term of this patent subsequent to Feb. 23, 2005 has been disclaimed.

[21] Appl. No.: 746,158

[22] Filed: Aug. 14, 1991

Related U.S. Application Data

[63] Continuation of Ser. No. 627,910, Dec. 17, 1990, abandoned, which is a continuation of Ser. No. 431,717, Nov. 3, 1989, abandoned, which is a continuation of Ser. No. 320,821, Mar. 9, 1989, abandoned, which is a continuation of Ser. No. 177,961, Aug. 14, 1987, abandoned, which is a continuation of Ser. No. 18,846, Feb. 24, 1987, Pat. No. 4,727,266, which is a continuation of Ser. No. 681,291, Dec. 13, 1986, abandoned.

[30] Foreign Application Priority Data

Dec. 23, 1983 [JP] Japan .................................. 58-243432

[51] Int. Cl.⁵ .............................................. H03K 17/16
[52] U.S. Cl. ..................... 307/443; 307/451; 307/475
[58] Field of Search ............... 307/443, 448, 450–452, 307/475, 481, 577, 579, 584, 585, 591, 594, 596, 597, 601, 605, 303, 304, 242; 357/45

[56] References Cited

U.S. PATENT DOCUMENTS

| | | | |
|---|---|---|---|
| 3,378,783 | 4/1968 | Gibson | 307/451 X |
| 4,255,672 | 3/1981 | Ohno et al. | 307/467 |
| 4,611,236 | 9/1986 | Sato | 357/45 |

Primary Examiner—David Hudspeth
Attorney, Agent, or Firm—Staas & Halsey

[57] ABSTRACT

As the number of output circuits in LSI or VLSI circuits increases, the chance of many large output circuits operating as a same instant increases, which can cause a malfunction in the logic due to induced switching noise. In order to prevent such a problem, the switching speed of the driving buffer circuit for an output buffer circuit is controlled. By reducing the switching capacity of the driving circuit, the switching speed of the total circuit is not greatly affected and the noise is greatly decreased. Control of the switching capacity of the driving buffer circuit is performed by master slice technology. This opposite design concept, compared to that of prior art LSI design, has been proved by experiments.

2 Claims, 8 Drawing Sheets

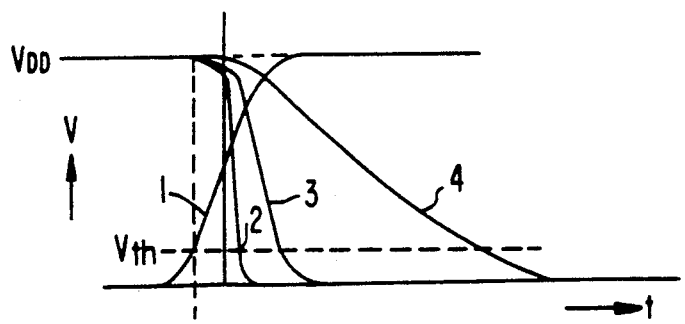
FIG. 6(a).
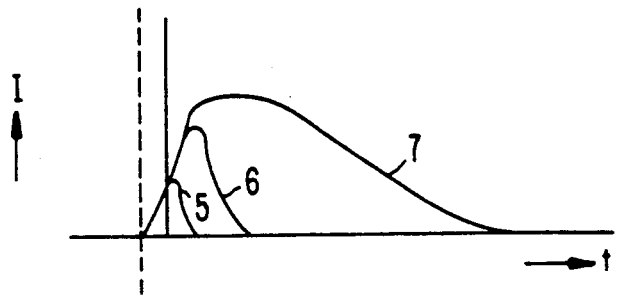
FIG. 6(b).
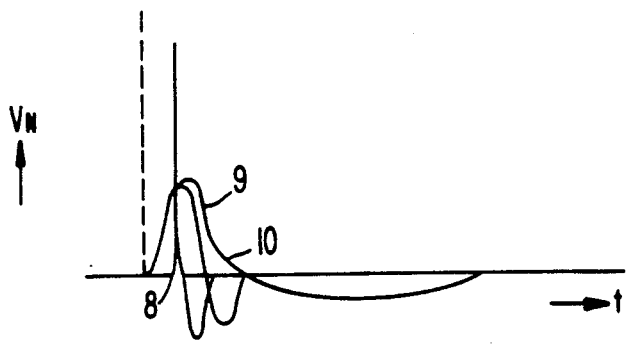
FIG. 6(c).
FIG. 7.
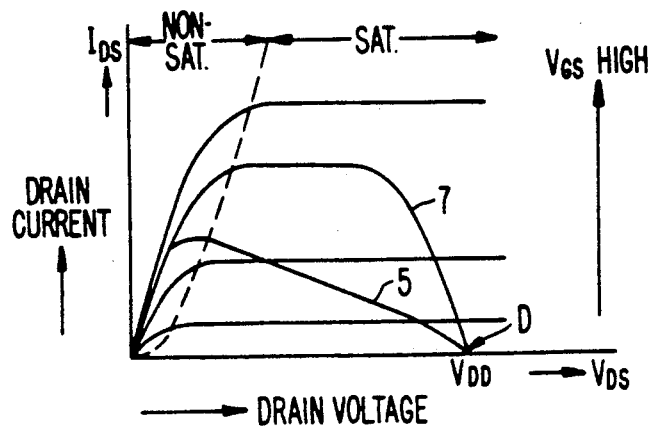

LSI GATE ARRAY HAVING REDUCED SWITCHING NOISE

This application is a continuation of application Ser. No. 07/627,910, filed Dec. 17, 1990; now abandoned; which is a cont. of Ser. No. 431,717, filed, Nov. 3, 1989; abandoned which is a continuation of Ser. No. 320,821, filed Mar. 9, 1989; abandoned; which is a continuation of Ser. No. 177,961, filed Aug. 14, 1987; abandoned; which is a continuation of Ser. No. 018,846, filed Feb. 24, 1987; which is now U.S. Pat. No. 4,727,266, and which is a continuation of Ser. No. 681,291, filed Dec. 13, 1986, abandoned.

CROSS-REFERENCED TO RELATED APPLICATION

This application is related to U.S. application Ser. No. 018,846, filed Feb. 24, 1987 now U.S. Pat. No. 4,727,266 which is a continuation of U.S. application Ser. No. 681,291, filed Dec. 13, 1984, now abandoned.

BACKGROUND OF THE INVENTION

1. Field of the Invention

The present invention is directed to a large scale integrated circuit (LSI) which includes gate array circuits comprising MIS (metal insulator semiconductor) or CMIS (complementary MIS) type FETs (field effect transistors). More particularly, the present invention is directed to an output buffer circuit of a gate array. The present invention is intended to reduce noise induced by high current variations, or to stabilize a fluctuation of ground, both of which are caused by switching between output buffer circuits.

2. Description of the Prior Art

General LSIs are provided with input buffer circuits (or level shifters) which equalize signal levels of input signals to inner logic circuits or equipment. Recently, as the scale of integration in LSI circuits has become large, the number of gates included in an LSI circuit exceeds a few tens of thousand of gates per chip, and the number of output gates exceeds a few hundred. The output buffer circuit requires a high switching speed and driving capacity in order to drive various kinds of external loads. A noise problem exists, which is induced by a high switching current of the output circuit. Noise is becoming a serious problem for LSI or VLSI (very large scale integration) circuits, which are designed to operate with very small current.

In order to render clearly set forth the advantage of the present invention, prior art output buffer circuits and their design concepts will be described briefly. Circuit diagrams for some exemplary output gate circuits are shown in FIGS. 1 through 3. FIG. 1 is a non-inverting output buffer circuit, FIG. 2 is an inverting output buffer circuit and FIG. 3 is a NAND type output buffer circuit exemplifying an output buffer circuit coupled with a NAND gate. Throughout FIGS. 1-3, (a) is a symbol mark of the circuit and (b) is a circuit diagram of the inner connections of the gate circuit. In FIGS. 1-3, IN designates an input terminal which connects the gate circuit to the inner logic circuit, OUT is an output terminal, and $G_1$ is a driver gate for an output buffer gate circuit $G_2$. $V_{DD}$ is a high voltage source and $V_{SS}$ is a low voltage source (usually earth potential). As can be seen in the figures, the output buffer gate circuit $G_2$ consists of a complementary MOS (CMOS) circuit comprising a p-channel MOS (p-MOS) FET $T_1$, and an n-channel MOS (n-MOS) FET $T_2$.

The driving force or driving capacity of the output buffer circuit is determined by the output impedance or mutual conductance gm of the CMOS FETs $T_1$ and $T_2$. The following relation is known in the art:

$$gm \, \alpha \, \beta \, \alpha \, \frac{W}{L}$$

where $\beta$ is the current amplification factor of the transistor, W is the gate width of the FET, and L is the gate length of the FET. Therefore, a high driving capacity of the output buffer circuit is attained by shortening the gate length L and making W large, that is, elongating the transistor.

In prior art LSI devices the ratio W/L of transistors for an inner gate $G_0$, for the driving gate $G_1$, and for the output buffer gate $G_2$ are determined respectively as, for example, 1:3:10 or 1:5:20, during the design stage of the LSI device. These ratios are determined to minimize the chip area, or to minimize the switching time of the output buffer gates.

Recently there appeared some attempts to optimize the size of the output buffer circuit and its driving stage. For example, Japanese Provisional Publication No. 57-148363 by K. Kinoshita (laid open on Sep. 9, 1982) or No. 58-127347 by S. Wakamatsu (laid open on Jul. 29, 1983) show some of them. These references attempt to optimize the output circuit introducing the idea of master slice technology, that is, a plurality of transistors (FETs) having predetermined sizes (for example three sizes having a size ratio of 1:2:3) are fabricated at the I/O (input/output) circuit area of an IC chip, and they are properly connected by a wiring pattern.

FIGS. 4(a)-4(c) illustrate this idea. In FIG. 4(a), part of the I/O area which is generally located at the peripheral part of the chip is shown. As shown in FIG. 4(a), 11 are the smallest size FETs, 12 are the second size FETs whose size is twice of that of FETs 11, and 13 are the largest FETs (three times as large as FETs 11). If two fan out circuits or three fan out circuits are required as shown in FIG. 4(b) or 4(c), proper size FETs are selected and connected to each other as shown. For example, for a two fan out circuit the second size FET 15 is used to drive two small size FETs 14. For a three fan out circuit, the largest size FET 17 is used to drive three small FETs 14. In such a manner, a decrease in the switching speed is prevented.

As has been described above, prior art output gate circuits are designed to operate as fast as possible. The high speed and high driving capacity of the output buffer circuit is attained by increasing the switching current handled by output transistors. High current switching has increased the problem of induced noise, especially for very large scale integrated circuits (VLSI). The inner logic circuit, which is a main part of the logic circuit, is designed to work with a current as small as possible to prevent heat dissipation, but the output circuit cannot cut down the switching current to drive outer circuit which generally has a large stray capacitance. Moreover, as the number of output buffer circuits increases, there occurs a change that several output circuits work at the same instant, so the multiplied switching current induces noise in the wiring lines or pins in the package, and causes malfunctions in the device. This is becoming a serious problem for VLSI circuits.

The voltage fluctuation $V_N$ which appears on the $V_{SS}$ line is given as:

$$V_N = RI + L \frac{dI}{dt}$$

where R is the resistance of the wiring, L is the inductance of the $V_{SS}$ line and I is the current flowing in the $V_{SS}$ line. This voltage flucuation causes the noise and malfunction of the inner circuit. If the circuit is designed to have a large value of W/L in order to achieve a high switching speed or a high driving capacity, the current amplification factor $\beta$ becomes large since the current I is proportional to $\beta$, which is proportional to W/L.

There exists a trade off, therefore, between achieving a high speed switching or a high driving capacity and decreasing the switching noise. It is especially serious for LSI or VLSI circuits, wherein many of the output buffer circuits have a chance to work at the same time, and by the sum of the switching currents, noise is induced on the $V_{SS}$ line or on the $V_{DD}$ line, and a malfunction of the main logic circuit results.

SUMMARY OF THE INVENTION

An object of the present invention, therefore, is to provide an output buffer circuit which has a high switching speed and a high driving capacity, but still has low switching noise.

The inventors noticed that the switching time of the output buffer circuit is mainly determined by the switching speed of the output gate as long as the driving gate circuit has a high enough switching speed and driving capacity. On the other hand, the switching noise increases as I (the current running through the circuit) and its time derivative dI/dt increases. The current I is determined by an external load which the IC must drive, so it cannot be decreased. But dI/dt has some room for decreasing its value. A decrease of dI/dt increases the switching time but not a great deal, while on the other hand, the switching noise is decreased drastically.

The design concept of the output buffer circuit of the present invention is contrary to that of prior art designs. Control of dI/dt is difficult to perform in the output side of the output gate because the load varies often. In the present invention, therefore, control takes place in the input side of the gate circuit. Namely the switching speed of the driving circuit is controlled employing master slice technology.

The present invention utilizes the fact that the transient current which runs through the MIS FET depends on the waveform of its input signal and does not depend on the load capitance. The gate size of the driving circuit (driver gate) is intentionally decreased, and accordingly, the input waveform to the output buffer gate circuit is properly blunted. The output waveform is then similarly blunted, and the transient current in the output circuit is decreased. Thus, the switching noise is decreased. Though the output waveform is slightly blunted, the maximum current supplied by the output buffer circuit does not vary, so the driving capacity of the circuit does not vary. Control of the driver gate size is performed by master slice technology.

These together with other objects and advantages, which will be subsequently apparent, are more fully described hereinafter with reference to the accompanying drawings. In the drawings, like numerals refer to like parts throughout.

BRIEF DESCRIPTION OF THE DRAWINGS

FIGS. 6(a)-6(c) are voltage and current waveforms appearing at several points of the circuit of FIG. 5;

FIG. 7 is a graph of the characteristics of drain current vs drain voltage of a prior art MIS FET;

FIGS. 10(a) and 10(b) are plan views of a chip according to the present invention, wherein:

FIG. 10(a) is a schematic plan view of a chip; and

FIG. 10(b) is an enlarged plan view showing a portion of the I/O area in FIG. 10(a).

FIGS. 11(a)-11(d) are various diagrams of an output buffer circuit embodying the present invention, wherein:

FIG. 11(a) is a plan view of a CMIS FET pattern appearing on the chip before wiring;

FIG. 11(b) is a cross sectional view of the device along a ling AA in FIG. 11(a);

FIG. 11(c) is a cross sectional view of the device along a line BB in FIG. 11(a); and FIG. 11(d) is a circuit diagram of FIG. 11(c);

FIGS. 12(a) and 12(b) are diagrams of another embodiment of the wiring for the pattern of FIG. 11(a), so as to decrease the driving capacity of the circuit to half that of FIG. 11(a) wherein:

FIG. 12(a) is a plan view of the device illustrating its wiring patterns; and

FIG. 12(b) is an equivalent circuit diagram of FIG. 12(a);

FIGS. 13(a) and 13(b) are embodiments of the wiring for the pattern in FIG. 11(a), so as to provide the same driving capacity as that in FIG. 11(a), wherein:

FIG. 13(a) is a plan view of the device illustrating its wiring pattern; and

FIG. 13(b) is an equivalent circuit diagram of FIG. 13(a); and

DESCRIPTION OF THE PREFERRED EMBODIMENTS

Figure 5:
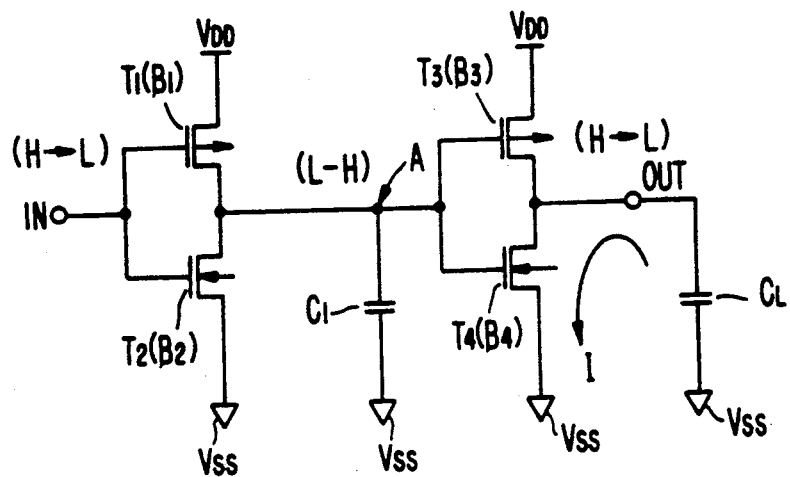
FIG. 5 is a circuit diagram of a prior art non-inverting output buffer circuit.

FIG. 5 is a circuit diagram of a prior art non-inverting output buffer circuit. The circuit employs two pairs of CMIS FETS, $T_1$, $T_2$ and $T_3$, $T_4$. $T_1$ and $T_3$ are p-channel FETs, and $T_2$ and $T_4$ are n-channel FETs. Each CMIS forms an inverter, and the inverters are operationally connected in series so as to work as a non-inverting type circuit. In FIG. 5, IN designates an input terminal commonly connected to the gate electrodes of FETs $T_1$ and $T_2$. The drain electrode of $T_1$ and the source electrode of $T_2$ are connected to each other, and they are connected to the gate electrodes of the second stage inverter $T_3$ and $T_4$. The drain electrode of $T_3$ and the source electrode of $T_4$ are connected to each other and provide an output to an output terminal OUT. The source electrodes of $T_1$ and $T_3$ are connected to a positive voltage source $V_{DD}$, and the drain electrodes of $T_2$ and $T_4$ are connected to a lower voltage source $V_{SS}$ (usually ground). $C_1$ is a stray capacitance of the wiring circuit and the gate electrodes of $T_3$ and $T_4$. $C_L$ is a stray capacitance of a load including the wiring circuit.

When the input signal is varied from a high level (H) to a low level (L), the potential at the node A in FIG. 5 varies from L to H. Then the n-channel FET $T_4$ becomes conductive (ON), and the p-channel FET $T_3$ becomes non-conductive (OFF). Thus, the charge stored in the load capacitance $C_L$ is discharged through the FET $T_4$, and the output signal varies from H to L.

FIG. 6 is a waveform diagram of waveforms which appear at the same instant at several points in the circuit in FIG. 5. FIGS. 6(a), 6(b) and 6(c) show, respectively, the voltage waveform (V) of output terminal OUT, the current waveforms of transient current (I) running through the FET $T_4$, and the noise voltage ($V_N$) induced in the $V_{SS}$ line.

In FIG. 6(a), curve 1 is a waveform of an input signal applied at the node A (that is $V_{GS}$ of the output FET $T_4$) illustrating the building up of the signal. Curve 2 is a waveform of the output voltage when the load capacitance $C_L$ is very small. Curve 4 is the output voltage waveform when the load capacitance is very large, and curve 3 is the output voltage waveform when the load capacitance is intermediate between curves 1 and 4. As can be seen by these waveforms, the output voltage begins to drop as soon as the input voltage (curve 1) exceeds the lower threshold voltage $V_{th}$, and current flows through the FET $T_4$. In curve 2, the output voltage decreases very rapidly and the charge stored in the load capacitance is almost discharged before the input voltage rises up sufficiently and before the current increases to saturation current, because the load capacitance $C_L$ is very small. In curve 4, the output voltage decreases slowly, so the input voltage rises to the source voltage $V_{DD}$ (5 volts for example), and FET $T_4$ becomes sufficiently ON, so the saturation current flows through FET $T_4$. Curve 3 corresponds to the intermediate state between these two cases.

FIG. 6(b) is a waveform diagram of current waveforms running through FET $T_4$. Curves 5, 6 and 7 correspond, respectively, to curves 2, 3 and 4 in FIG. 6(a). The current begins to flow as soon as the input voltage (curve 1) exceeds the threshold voltage $V_{th}$. When the load capacitance is small (curve 5), the charge is quickly discharged with a small maximum current. When the load capacitance is very large (curve 7), the current rises to the saturation current, and then decreases slowly. Curve 6 is the intermediate case.

FIG. 6(c) is a waveform diagram of the voltages induced by the currents running through the FET $T_4$ which are shown in FIG. 6(b). This corresponds to the switching noise $V_N$. Curves 8, 9 and 10 correspond, respectively, to curves 2, 3 nd 4 in FIG. 6(a). It will be easily understood by one skilled in the art that the induced voltage is proportional to the time derivative of the current (dI/dt), that is, the transient current running through the output FET. Therefore, if it is intended to decrease the switching noise, it is necessary to reduce the peak values of curves 8, 9 and 10 in FIG. 6(c). It should be pointed out that the noise voltage appears in both the positive and negative sides of the voltage, as can be seen in FIG. 6(c); the peak value of the noise does not vary much for each curve, that is, the noise does not depend on the load capacitance. This means that the buildup of the current in FET $T_4$ is determined by the voltage buildup (curve 1) at the input side (node A) of FET $T_4$. If it is intended, therefore, to suppress the noise, it is necessary to blunt the waveform of the current.

Generally, the ground line ($V_{SS}$ line) of an LSI device is made from aluminum or gold, and has a resistance R and an inductance L. The resistance R can be divided into $R_1$ and $R_2$ and the inductance L can be divided into $L_1$ and $L_2$, respectively. The suffix 1 designates the value for the line from the chip to the pin of the package (Usually, $R_1 < R_2$ and $L_1 < L_2$). Therefore, if a large current runs through the $V_{SS}$ line, the ground potential of the LSI chip varies, and causes a malfunction in the logic circuits. The variation of the ground level, or the noise $V_N$ can be expressed as $$V_N \alpha RI + L \frac{dI}{dt} \qquad (1)$$

where $L = L_1 + L_2$, and $R = R_1 + R_2$

Among these equations, R is less than $0.1\Omega$, and it can be decreased even more by making the $V_{SS}$ line thick or by increasing the number of $V_{SS}$ pins and using them in parallel, so as to eliminate the effect of R. Therefore, the noise that appears in the $V_{SS}$ line depends mainly on the variation of current dI/dt in the $V_{SS}$ line.

This noise is induced on other pins of the package and causes malfunctions of an inner logic circuit and external load equipment or circuits. In VLSI circuits, since the number of output buffer circuits increases, there occurs a chance that many of them operate at the same instant, and many switching currents rush onto the $V_{SS}$ line at the same time, thus increasing the noise.

FIG. 7 is a waveform diagram of the relationship between drain current $I_{DS}$ and drain voltage $V_{DS}$ for various gate voltages $V_{GS}$ of an FET. As is widely known, the drain current $I_{DS}$ has a saturation region SAT and a non-saturation region NON-SAT. The saturation current varies depending on the gate voltage $V_{GS}$. In FIG. 7, curves 5 and 7 are superposed and indicate the trajectory of the drain voltage of the output FET $T_4$, corresponding to curves 5 and 7 in FIG. 6(b).

With respect to curve 5 in FIG. 7, the switching action starts from point D where the current $I_{DS}$ is 0, and the voltage is $V_{DD}$. As the gate voltage $V_{GS}$ (input voltage) rises, the current $I_{DS}$ begins to flow, at the same time the voltage $V_{DS}$ (output voltage) decreases since the load capacitance is small, and the voltage drops rapidly, even when the current $I_{DS}$ is small.

With respect to curve 7 of FIG. 7, the switching action starts from point D (similar to curve 5), but since the load capacitance is very large, the drain voltage decreases slowly, and as the gate voltage $V_{GS}$ increases, the current $I_{DS}$ increases. After passing a maximum current which is determined by $V_{CC}$ and $V_{GS}$, (this is a saturation current, since $V_{GS} > V_{th}$) the current decreases. It should be pointed out that the inclination of curves 5 and 7 does not indicate the steepness of the current build-up, since the horizontal axis of FIG. 7 is not with respect to time but with respect to the drain voltage $V_{DS}$.

As can be seen in FIG. 7, when the FET is operating in the saturation region, the transient current running through the output FET depends on the load capacitance and the gate voltage. When the FET is operating in the non-saturation region, the transient current does not depend on the load capacitance. It is known that when the FET is operating in the saturation region, the current I running through the FET is given as $$I \, \alpha \beta \cdot (V_{GS} - V_{th})^2 \quad (2)$$

So the derivative of the current dI/dt is obtained by differentiating equation (2) by t, $$\frac{dI}{dt} \, \alpha \, \beta \cdot (V_{GS} - V_{th}) \frac{dV_{GS}}{dt} \, \alpha \sqrt{\beta} \, \sqrt{I} \, \frac{dV_{GS}}{dt} \quad (3)$$

Where, $\beta$ is the current amplification factor, $V_{GS}$ is the gate voltage and $V_{th}$ is the threshold voltage.

As mentioned before, the switching noise depends on the inductance L and the transient current dI/dt through the output FET. It is difficult to control the transient current on the output side of the buffer FET, since the current varies with the load capacitance. Taking into account the fact that the transient current depends on the input signal level $V_{GS}$ of the output FET, the present invention intends to decrease the noise due to the switching current by slowly varying the input signal of the output FET. This is an opposite design concept for LSI circuits compared to that of the prior art. By varying the input signal of the output FET, the switching speed is slightly affected, but not seriously, and the noise is drastically reduced.

The above situation can be explained as follows. Curves 5 and 7 in FIG. 7 can be considered to correspond, respectively, to a large $\beta$ FET and a small $\beta$ FET, both having the same load capacitance. The switching speed is determined by the $\beta$ or load capacitance of the final stage FET.

Generally, the switching speed of the final stage output FET is made as large as possible and its $\beta$ made as high as possible. Usually the switching speed of the output buffer circuit is still lower than that of its input driving buffer circuit, even though the $\beta$ or current flow is large. In other words, the switching speed of the output buffer circuit is slower than that of the driving buffer circuit. In the present invention, the final stage FET is not altered from the prior one, so the driving capacity and switching speed of the output FET is not altered, but its input waveform is blunted, so the current build-up in the output FET is blunted, keeping its maximum current unaltered.

Figure 8A:
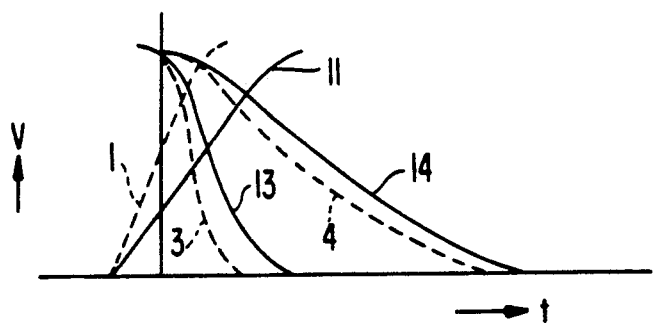
FIGS. 8(a)-8(c) are voltage and current waveforms corresponding to the curves of FIG. 6, comparing the improved waveforms of the present invention to those of the prior art.
Figure 8B:
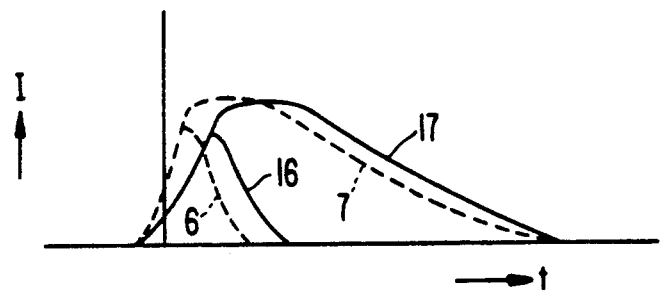
Figure 8C:
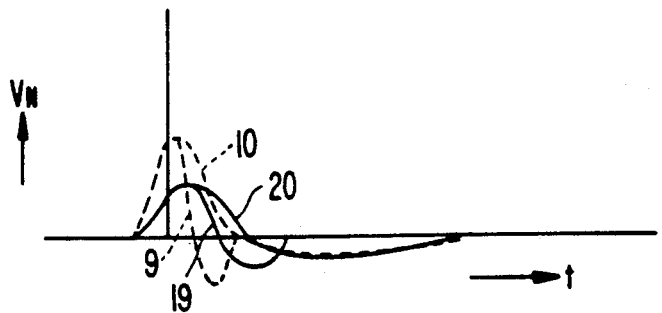

FIGS. 8(a)-8(c) are waveform diagrams of the curves corresponding to those in FIG. 6, wherein FIG. 8(a) shows voltage waveforms of the input and output of the buffer circuit, FIG. 8(b) shows the current waveforms running through the FET, and FIG. 8(c) shows the noise voltage $V_N$ which appears in the $V_{SS}$ line when the FET is switched ON and OFF. These waveforms compare when the input signal is blunted (solid lines) to when the input signal is not blunted (broken lines). The broken lines having the same reference numerals depict the same curves as in FIGS. 6(a)-6(c).

When the input signal is blunted slightly, for example, the slope of the input signal 11 is blunted to half of that of curve 1, the output current waveform 3, which correspondes to a medium load capacitance, will be blunted as shown in curve 13. By this blunting the output current 6 will be blunted to the curve 16, which is half as steep as the build-up curve, since the build-up is in the saturation condition of the FET and the current is determined by the gate voltage (input voltage) of the FET. The noise voltage decreases from that shown in curve 9 to that shown in curve 19, which has a peak value reduced to half of curve 9.

If the load capacitance is very large, which is shown by curve 4, it will become that shown in curve 14. In this case the variation is not much because the FET is saturated and the current is determined substantially by the load capacitance and the saturation current of the FET. The current variation in the FET is shifted from that shown in curve 7 to that shown in curve 17. Thus, the noise voltage decreases from that shown in curve 10 to that shown in curve 20. Since the build-up current is the same for all of these cases, the noise voltage corresponding to the build-up current is almost the same, but the noise corresponding to the build-down current is much lower. In any case, the noise voltage is decreased by half that of the initial case. It can be seen from these diagrams that the switching time does not increase by twice the initial value. In particular, when the load capacitance is large the switching time is small.

In general, the switching action of the output buffer circuit corresponds to that of the curve 4, and the switching action of the driving buffer circuit or its input signal correspond to curves 3 or 2 in FIG. 6. Therefore, the present invention blunts the input signal to the output buffer circuit, and reduces the noise without lowering the switching speed.

Figure 9:
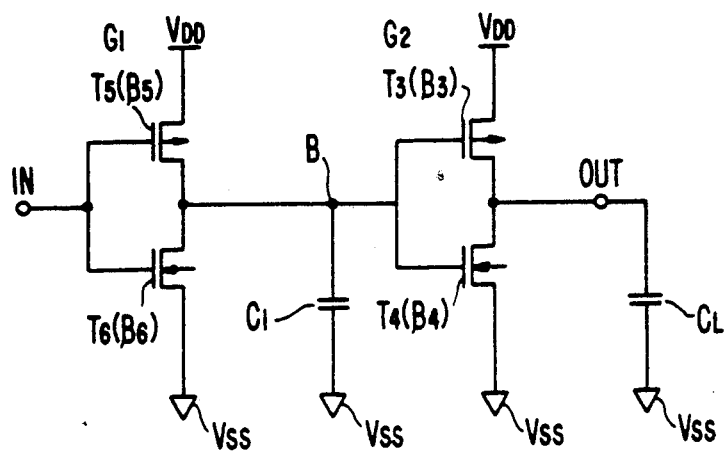
FIG. 9 is a circuit diagram of an output buffer circuit according to the present invention.

FIG. 9 is a circuit diagram of an output buffer circuit according to the present invention. The circuit employs two pairs of CMIS FETs $T_5$, $T_6$ and $T_3$, $T_4$. The transistors $T_5$ and $T_3$ are p-channel FETs, and $T_4$ and $T_6$ are n-channel FETs. Each CMIS forms an inverter, and the inverters are connected in series to form a non-inverting type circuit. In FIG. 9, IN designates an input terminal commonly connected to the gate electrodes of FETs $T_5$ and $T_6$. The drain electrode of $T_5$ and the source electrode of $T_6$ are connected to each other, and are commonly connected to the gate electrodes of the second stage inverter transistors $T_3$ and $T_4$. The drain electrode of $T_3$ and the source electrode of $T_4$ are connected to each other and provide output signals to the output terminal OUT.

Unlike the prior art circuit of FIG. 5, the $\beta$ of the FETs $T_5$ and $T_6$ are adjusted, and the other characteristics of the device are not altered. Therefore, the switching time and switching capacity of FETs $T_3$ and $T_4$ are not altered, but the switching speed of the driving buffer circuit ($T_5$ and $T_6$) is adjusted. Usually, adjustment of the current waveform at the output side of the FET is difficult because the load varies so often. In the present invention, however, the load (the gate circuits of the output buffer circuit $T_3$ and $T_4$) of the driving buffer FETs $T_5$ and $T_6$ is always constant. Therefore, the input waveform to FETs $T_3$ and $T_4$ is varied by varying the $\beta$ of the driving FETs $T_5$ and $T_6$. For example, if the $\beta$ of FET $T_5$ is half that of the prior art circuit ($T_1$), (that is $\beta_5 = \frac{1}{2}\beta_1$) the current of the driving buffer circuit becomes $\frac{1}{2}$. Accordingly, the waveform at point B is blunted and the transient current dI/dt of the driving buffer circuit or the switching noise is reduced.

In the above explanation the noise on the $V_{SS}$ side has been described, but this noise is similar to the noise induced on the $V_{DD}$ side. In this case, the comparison of $\beta_6$ of FET $T_6$ to that of $T_2$ will lead to the same results.

As mentioned before, $\beta$ is varied by varying the ratio of gate width W and gate length L (W/L). Of course, the adjustment of the ratio W/L can be performed during the design stage of the chip, but since the adjustment is not critical, it can be adjusted employing master slice technology as discussed below.

Figure 10B:
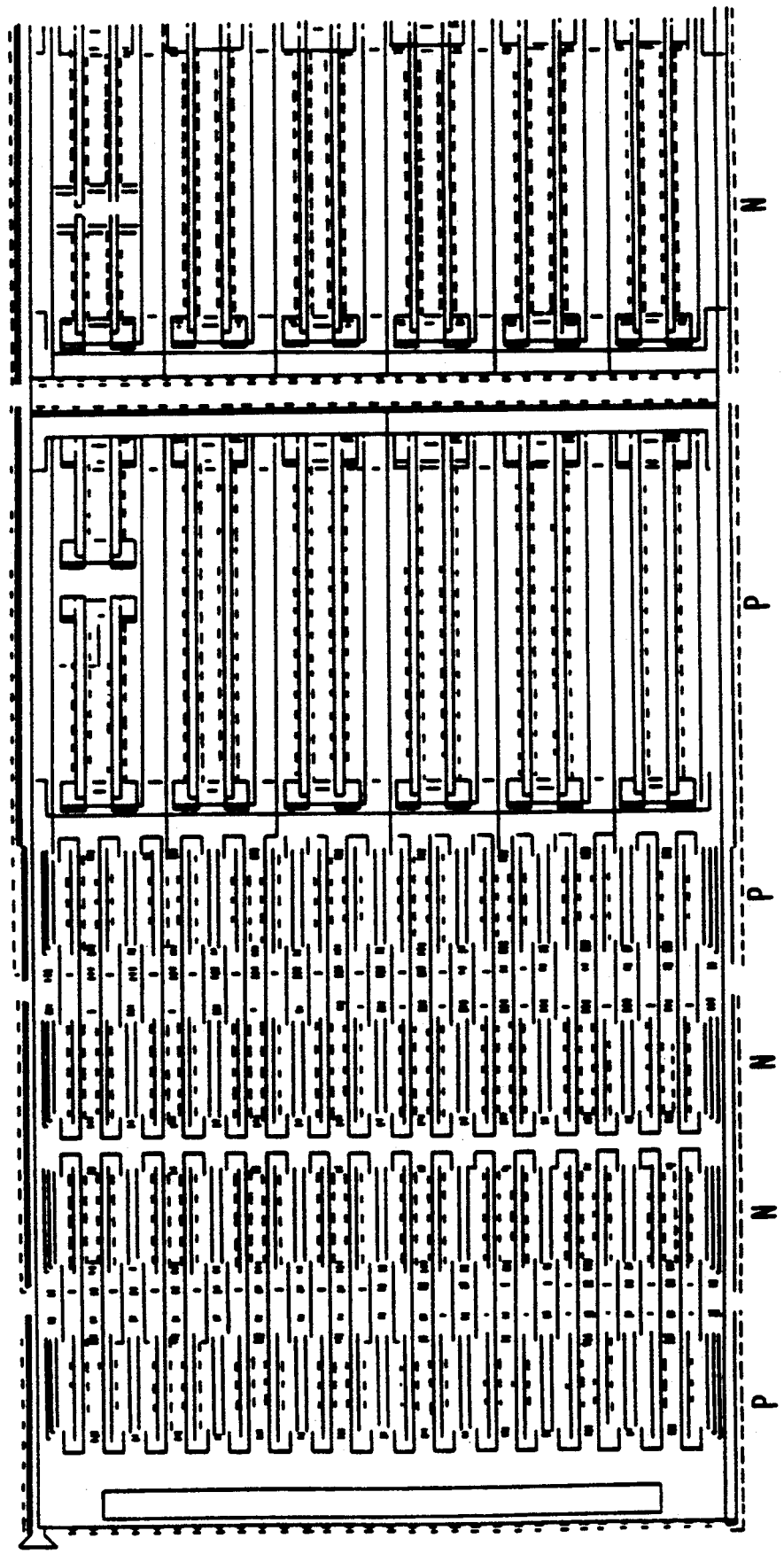
Figure 10A:
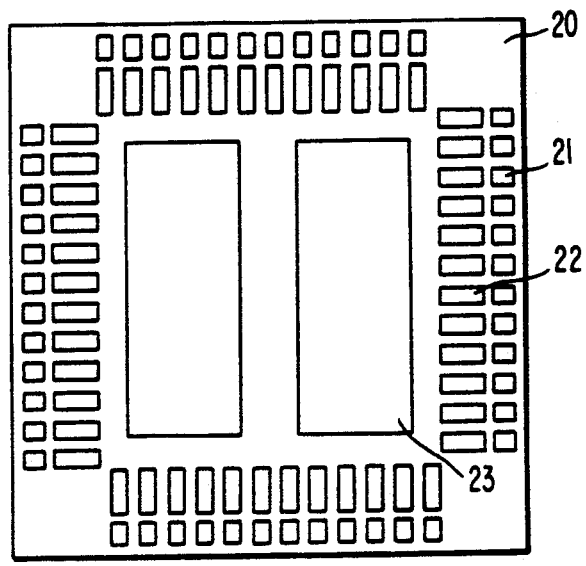

FIG. 10(a) is a schematic plan view of a gate array LSI chip according to the present invention. In FIG. 10(a), 20 designates the chip on which the inner logic circuit (main logic circuit) 23 is fabricated on a center portion of the chip. Details of the main logic circuit are omitted in the figure. On the peripheral part of the chip 20 are fabricated bonding pads 21 which are connected to the package by bonding wires (not shown). Between the bonding pads 21 and the inner logic circuits 23 are located I/O (input/output) circuits 22, which can handle a large current and include the circuit of the present invention. Blank areas of the chip are used for wiring between the circuits, but they are omitted from the figures for the sake of simplicity.

FIG. 10(b) is a magnified plan view of the portion for the I/O circuits 22 on the chip of FIG. 10(a), indicating patterns of small and large size FETs. On the left hand side of the figure are arranged small size FETs, and on the right hand side are arranged large size FETs. Also included are p-channel and n-channel FETs. The transistors are arranged in rows and columns as shown in FIG. 10(b), for the sake of design and fabrication convenience. The columns of the p-channel and n-channel FETs are designated by the symbols P and N, respectively. This is a general pattern arrangement, and accordingly there may be many modifications and variations within the spirit of the invention. For example, intermediate size transistors may be included to meet the circuit design. In FIG. 10(b), an example of the intermediate size FETs are shown on the first row of the right side columns. Control of $\beta$ or adjustment of the driving current is performed by selecting the size of the FET and wiring them according to a master slice chip design.

By using such a master slice, it is unnecessary to design the chip from the beginning of the fabrication process. By using the same patterned chip prepared before hand, various types of circuits can be realized. For example, in order to drive a heavy load, large FETs are connected in parallel to construct the output buffer circuit. For constructing a driving buffer circuit, a prefereable number and size of FETs are selected within the spirit and scope of the present invention. The transistors can be wired to form any buffer circuit by varying the wiring pattern.

Figure 11A:
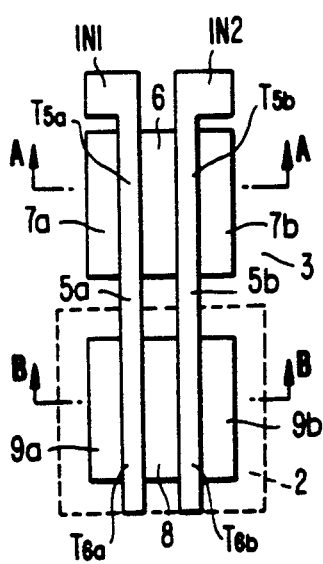
Figure 11B:
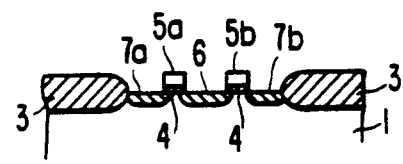
Figure 11C:
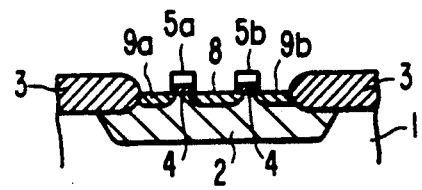
Figure 11D:
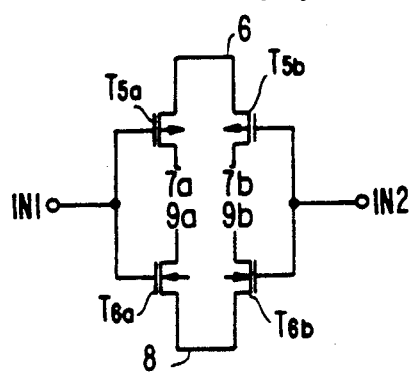

FIGS. 11(a)-11(d) are embodiments of a driving gate circuit which can vary its driving capacity ($\beta$ or maximum current) by varying its wiring pattern. FIG. 11(a) is a plan view of the gate circuit schematically showing its pattern appearing on the chip surface. FIGS. 11(b) and 11(c) show a cross sectional view of the gate circuit at the lines AA and BB, respectively, showing a bulk structure of a p-channel FET and an n-channel FET, and FIG. 11(d) is an equivalent circuit diagram of FIGS. 11(a)-11(c).

Figure 1A:
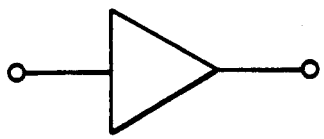
FIGS. 1(a) and 1(b) are circuit diagrams of a prior art non-inverting output buffer circuit.
Figure 1B:
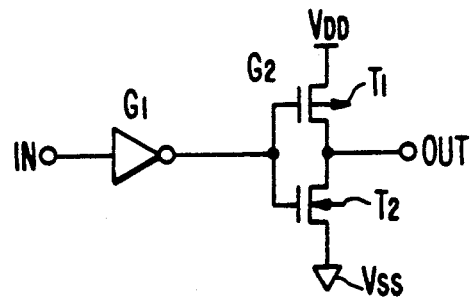

In FIGS. 11(b) and 11(c), 1 designates an n-type silicon substrate, and 2 is a p-type well fabricated in the n-type silicon substrate. The p-channel FETs $T_{5a}$ and $T_{5b}$ are fabricated on the upper part of FIG. 11(a), and n-channel FETs $T_{6a}$ and $T_{6b}$ are fabricated in the lower part of FIG. 11(a). Reference numeral 3 designates a field oxide layer, which separates the devices and has a wiring formed thereon. Reference numeral 4 is a gate oxide film, and gate electrodes 5a (first gate) and 5b (second gate) are fabricated on the gate oxide film. With respect to the p-channel FETs, 6 is a p+-type common drain region for the p-channel FETs, and 7a and 7b are first and second p+-type source regions. With respect to the n-channel FETs, 8 is an n+-type common drain region, and 9a and 9b are, respectively, first and second n+-type source regions. The gate electrodes of transistors $T_{5a}$ and $T_6$ are connected to each other by the first gate 5a, and are commonly connected to the first input terminal IN1. The gate electrodes of transistors $T_{5b}$ and $T_{6b}$ are connected to each other by the second gate 5b, and are commonly connected to the second input terminal IN2. Thus, they form complementary circuit-saligned in parallel with each other.

Structure and fabrication processes for such chips are quite common in the art so these details are omitted. The gate width of the FETs in FIG. 10 are designed to be half that of the driving FETs in prior art devices ($T_1$ and $T_2$). Therefore, if the FETs FIGS. 11(a)-11(d) are used for the driving gate, the input signal to the output FET is blunted compared to that of prior art devices. By varying the connection of these FETs it is possible to realize various kinds of output circuits having low switching noise.

Figure 12A:
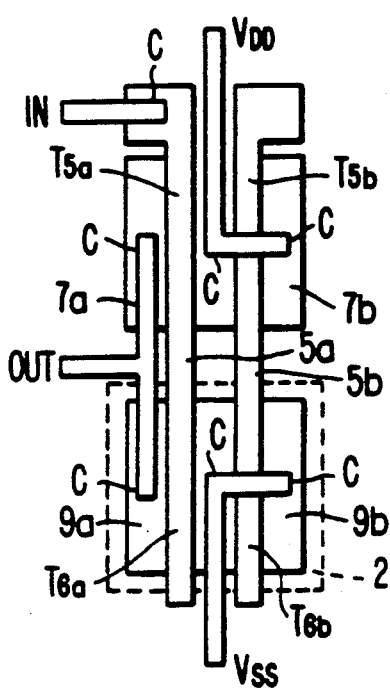
Figure 12B:
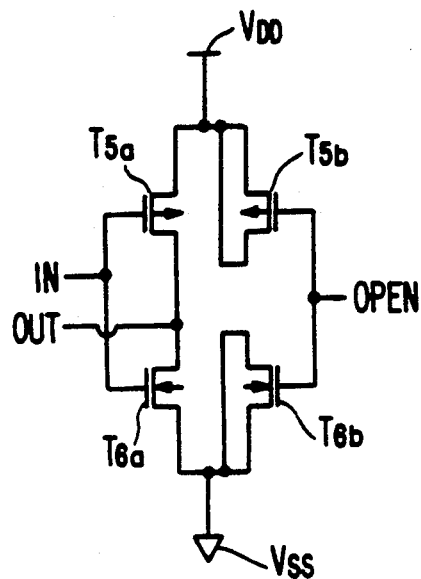

FIGS. 12(a) and 12(b) show the wiring of an embodiment of the present invention using the circuit pattern in FIG. 11(a). The connection of the pattern realizes a circuit having half the driving capacity (driving current) of prior art devices. FIG. 12(a) is a schematic diagram of the wiring pattern, and FIG. 12(b) is an equivalent circuit diagram of FIG. 12(a). In this case, only half (left side) of the pattern is used. In FIG. 12(a), heavy lines show the wiring pattern, and points C designate points where the wiring should contact the electrode. Contact is made directly to the electrode, or through a contact hole made in the insulation layer covering the surface of the electrodes. Such wiring is also conventional in the art.

Figure 2A:
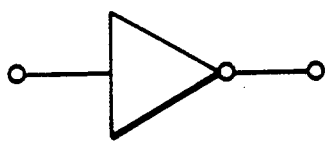
FIGS. 2(a) and 2(b) are circuit diagrams of a prior art inverting output buffer circuit.
Figure 2B:
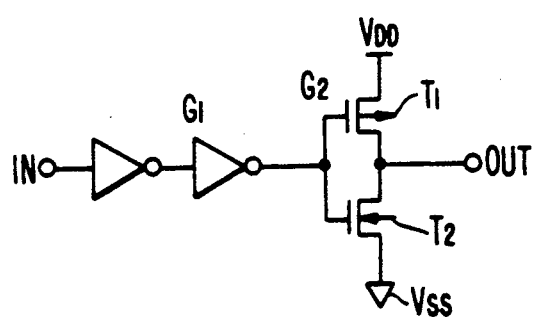
Figure 3A:
FIGS. 3(a) and 3(b) are circuit diagrams of a prior art NAND type output buffer circuit.
Figure 3B:
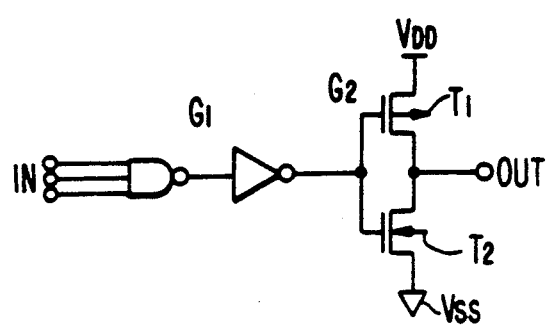

In FIG. 12(a) the common gate is used for an input IN, and the first n+-type region 7a and the first p+-type region 9a are connected to each other and the FETs $T_{5a}$ and $T_{6a}$ are connected in series between $V_{DD}$ and $V_{SS}$. The right half of the pattern is not used, so the source and drain electrodes of FETs $T_{5b}$ and $T_{6b}$ are shorted to each other. If the circuit in FIGS. 12(a) and 12(b) is used for driving an output buffer circuit, the input signal for the output buffer circuit is blunted since the gate width of FETs $T_{5a}$ and $T_{6a}$ are decreased to half the width of prior art transistors $T_1$ and $T_2$ (shown in FIGS. 1, 2 and 3) and the noise is reduced.

Figure 13A:
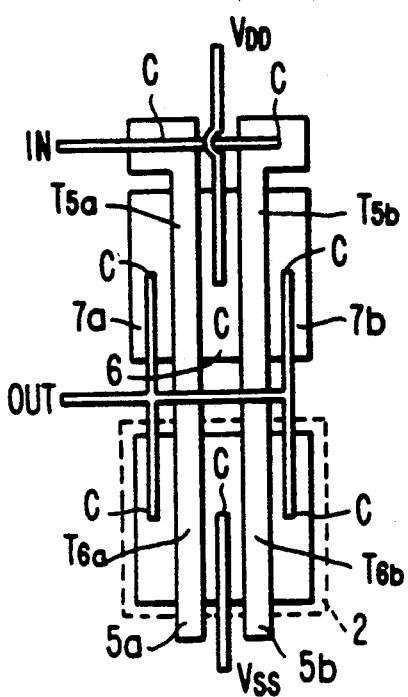
Figure 13B:
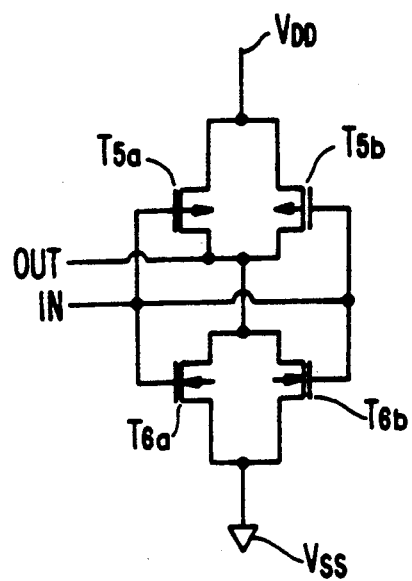

FIGS. 13(a) and 13(b) show the wiring of another embodiment of the pattern in FIG. 11(a), in which the driving current is increased to twice that of FIG. 12 in order to drive a larger output circuit. FIG. 13(a) is the wiring pattern and FIG. 13(b) is the equivalent circuit diagram of the wiring pattern. In this embodiment the left and right halves of the pattern are used in parallel. In FIG. 13(a), heavy lines indicate the wiring line, and the point C indicates where the wiring circuit contacts the electrodes. It will be clear to one skilled in the art that the pattern of FIG. 13(a) corresponds to the circuit in FIG. 13(b), and that the driving capacity is disabled compared to the driving capacity of the circuit in FIG. 12.

In the foregoing embodiments, a circuit pattern having common source or common drain FETs were used, but it is obvious that any pattern for the master slice can be used for the purpose of the present invention.

FIGS. 14(a)-14(d) are schematic diagrams of several output circuits illustrating how the driving capacity of the input and output buffer circuits is varied by connecting the unit circuit in series or parallel, so as to compare the effect of the present invention. In FIGS. 14(a)-14(d), G designates a buffer circuit, IN designates an input terminal and OUT designates an output terminal. These figures correspond to a case in which one or two input buffer circuits and output buffer circuits are combined. It will be obvious to one skilled in the art, that the number of circuits to be combined may be greatly increased. FIGS. 14(a)-14(d) should be considered as showing only typical cases.

Figure 14A:
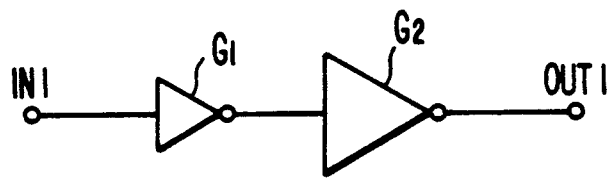
FIGS. 14(a)-14(d) are diagrams of typical output buffer circuits, illustrating how the driving capacity of the input and output buffer circuits are varied by combining unit circuits.

The circuit in FIG. 14(a) is an type output circuit composed of two inverters: $G_1$ is the driving buffer gate and $G_2$ is the output buffer gate.

Figure 14B:
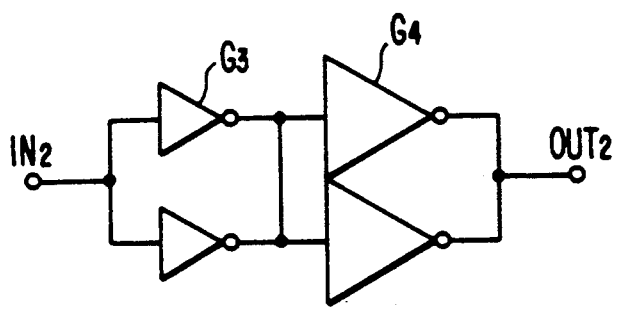

The circuit in FIG. 14(b) provides a driving capacity twice as high as that circuit in FIG. 14(a) and is formed from parallel circuits of FIG. 14(a). $G_3$ and $G_4$ correspond respectively to $G_1$ and $G_2$ in FIG. 14(a). In this case, the delay of the output signal is the same as that of FIG. 14(a), but the noise is also doubled.

each case, delay time and noise voltage were measured. In the table, the delay time was subdivided into the delay time due to the load capacitance and the total delay time. The former is obtained by subtracting the no load capacitance delay time from the total delay time. The noise voltage is given in relative values.

Figure 14C:
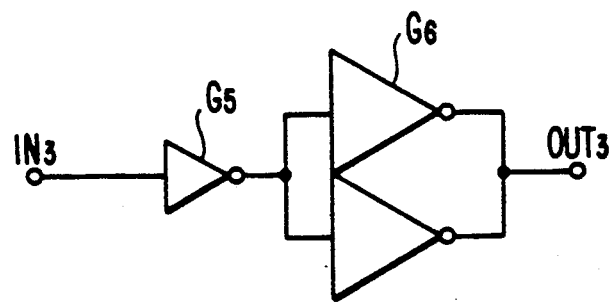
Figure 14D:
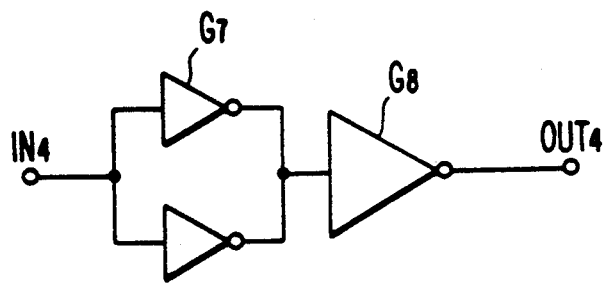

The measured values in the table confirm the above consideration of the present invention. For example:

a) the total delay time increases as the capacitive load increases, and is mainly determined by the capacitance;

b) the no load delay time is equal for circuits 14(a) and 14(b), and the delay time for the circuit 14(d) is shortest and is longest for the circuit 14(c);

c) the delay time for the circuits in FIG. 14(c) and 14(d) can not be half or twice of the delay time of the circuits in FIGS. 14(a) or 14(b), respectively;

d) increasing the driving capacity of the output buffer circuit reduces the delay time, but this effect is discounted by load capacitance;

e) the noise increases almost proportionally to the driving capacity of the output circuit (compare FIGS. 14(a) and 14(b);

f) the noise is greatly reduced by reducing the driving capacity of the driving buffer circuit (compare FIGS. 14(a), (b) and (c)); and g) increasing the driving capacity of the driving buffer circuit has little effect on the delay time improvement, but it greatly increases the noise.

TABLE 1

| CIRCUIT TYPE | WITHOUT CAPACITANCE nS | LOAD CAPACITANCE | | | | | | NOISE AMPLITUDE V |
|---|---|---|---|---|---|---|---|---|
| | | 10 pF | | 100 pF | | 200 pF | | |
| | | DUE TO CAPACITANCE nS | TOTAL DELAY nS | DUE TO CAPACITANCE nS | TOTAL DELAY nS | DUE TO CAPACITANCE nS | TOTAL DELAY nS | |
| a | 9.5 | 1.0 | 10.5 | 10.0 | 19.5 | 20.0 | 29.5 | 1a |
| b | 9.5 | 0.5 | 10.0 | 5.0 | 15.0 | 10.0 | 19.5 | 2a |
| c | 11.5 | 0.5 | 12.0 | 5.0 | 16.5 | 10.0 | 21.5 | <1a |
| d | 7.5 | 1.0 | 8.5 | 10.0 | 17.5 | 20.0 | 27.5 | ~2a |

Figure 4A:
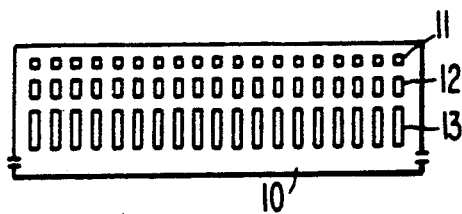
FIGS. 4(a)-4(c) are diagrams of prior art wiring connections of output buffer circuits utilizing master slice technology.
Figure 4B:
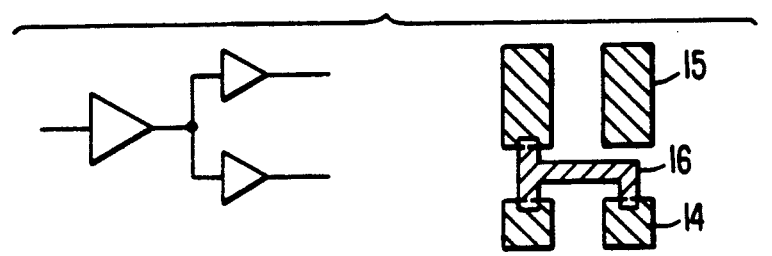
Figure 4C:
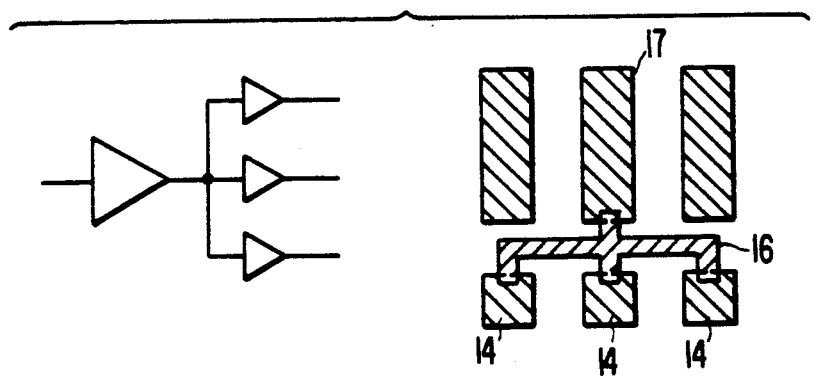

In the circuit of FIG. 14(c), the output buffer gate $G_6$ is twice the size of FIG. 14(a), so it has the same driving capacity as the circuit in FIG. 14(b). The driving buffer circuit comprises only one circuit, $G_5$, which corresponds to $G_1$ in the circuit in FIG. 4(a). Thus, the delay time of the signal becomes large compared to that of the circuits in FIG. 14(a) or 14(b), but the noise is reduced to less than that of FIG. 14(a). Generally, the load connected to the output OUT3 has a stray capacitance associated therewith. In the present invention, the delay time of the signal does not increase compared to that of the circuit in FIG. 14(b).

In the circuit of FIG. 14(d), the input buffer gate $G_7$ has twice the driving capacity as the input buffer gate $G_7$ in FIG. 14(a) or 14(c), but the output buffer circuit $G_8$ has the same driving capacity as that of the circuit in FIG. 14(a). This circuit has the highest switching speed, but it can not be twice that of the circuit in FIG. 14(a) because the switching time is substantially determined by the switching speed of the output buffer circuit $G_8$. In addition, the noise is almost twice that of the circuit in FIG. 14(a).

Table 1 summarizes the measured date in an experiment to prove the above circuit operations. Each of the buffer circuits, corresponding to the circuits (a), (b), (c) and (d) of FIG. 14, were formed from a standard master slice pattern. They were tested, respectively, for a case of no load capacitance and for cases having capacitive loads of 10 pF, 100 pF and 200 pF, respectively. For As can be seen from these experiments, it is meaningless to increase the switching speed of the driving buffer circuit. Moreover, increasing the switching speed has a serious effect on the noise. Of course, it is important to increase the switching speed of main logic circuit and output buffer circuit in order to attain a high speed device. With respect to the driving buffer circuit, its switching speed or driving capacity should be controlled from the standpoint of switching noise.

Practically, there must be an optimum switching speed for the driving buffer circuit. This is determined by the load condition of the output buffer circuit. Generally speaking, the switching speed of the driving buffer circuit is preferably two to five times as high as that of the output buffer circuit. However, the switching speed can be less than five (i.e., from one to five) times as high as that of the output buffer circuit for reduced switching noise. If the ratio of the switching speed of the input to output buffer circuit becomes larger, the noise increases.

As has been described above, prior art output buffer circuits intend to increase the switching speed, and the noise of the device is not considered. Therefore, the switching speed of the device circuit has been increased, (but not by large amount) and along with this increase, the switching noise of the device is increased.

Contrary to prior art, the present invention intentionally decreases the speed of the driving circuit, which does not increase the delay time of the signals, and greatly decreases the noise. This is obviously an opposite design concept to that of the prior art. The present invention is also suitable for LSI circuit design. The switching speed can be adjusted by master slice technology.

We claim:

1. A reduced switching noise semiconductor integrated circuit device comprising:
   a semiconductor substrate;
   a plurality of output terminals located at the periphery of said semiconductor substrate; and
   a plurality of output buffer circuits connected to said plurality of output terminals, each of said output buffer circuits being in a one-to-one correspondence to each of said plurality of output terminals, each of said output buffer circuits comprising:
      a final stage of said output buffer for driving an external load to be connected to said output terminal; and
      a driving buffer circuit having a current handling capacity smaller than the current handling capacity of said final stage of said output buffer, for driving said final stage of said output buffer, said final stage of said output buffer and said driving buffer circuit being arranged in each of said output buffer circuits such that each of said output buffer circuits forms a rectangular surface portion being in said one-to-one correspondence with each of said plurality of output terminals, said final stage of said output buffer and said driving buffer comprising standard gate circuits having complementary metal oxide semiconductor (CMOS) devices, said CMOS devices in said driving buffer having various configurations and predetermined gate dimensions, the size of said CMOS devices in said driving buffer circuit being smaller than the size of said CMOS devices in said final stage of said output buffer for providing saturated current in said driving buffer circuit for blunting input waveforms of said output buffer circuit and for reducing noise caused by current variation in said output buffer circuit.

2. A semiconductor integrated circuit device according to claim 1, wherein said final stages of said output buffer circuits comprise a predetermined number of transistors operatively connected in parallel, and wherein each of said driving buffer circuits comprise a plurality of transistors, the number of said plurality of transistors in said driving buffer circuits being less than said predetermined number of transistors in said final stages of said output buffer circuits.

* * * * *

UNITED STATES PATENT AND TRADEMARK OFFICE
CERTIFICATE OF CORRECTION

PATENT NO. : 5,132,563            Page 1 of 2

DATED : JULY 21, 1992

INVENTOR(S) : SHIGERU FUJII ET AL.

It is certified that error appears in the above-identified patent and that said Letters Patent is hereby corrected as shown below:

TITLE PAGE [63] line 8, "Dec. 13, 1986," should be Dec. 13, 1984,--.

TITLE PAGE, Col. 2, [56] References Cited

Delete this section and insert the following new sections:

| | | | |
|---|---|---|---|
| --3,378,783 | 4/1968 | Gibson | 307/451X |
| 3,983,619 | 10/1976 | Kubo et al. | 307/448X |
| 4,255,672 | 3/1981 | Ohno et al. | 307/467 |
| 4,311,925 | 1/1982 | Chang et al. | 307/448X |
| 4,394,588 | 7/1983 | Gaudenzi | 307/443 |
| 4,430,583 | 2/1984 | Shoji | 307/448 |
| 4,479,067 | 10/1984 | Fujita | 307/448X |
| 4,504,959 | 3/1985 | Hackenbach | 307/475X |
| 4,611,236 | 9/1986 | Sato | 357/45 |

UNITED STATES PATENT AND TRADEMARK OFFICE
CERTIFICATE OF CORRECTION

PATENT NO. : 5,132,563

DATED : JULY 21, 1992

INVENTOR(S) : SHIGERU FUJII ET AL.

It is certified that error appears in the above-identified patent and that said Letters Patent is hereby corrected as shown below:

OTHER PUBLICATIONS

Mead and Conway, Introduction to VLSI Systems, Addison-Wesley Publ. Col., Reading, Mass. 10/80, p. 5-14.--.

Col. 1, line 14, "1986," should be --1984,--.

Signed and Sealed this

Twenty-eighth Day of September, 1993

Attest:

BRUCE LEHMAN

Attesting Officer    Commissioner of Patents and Trademarks